United States Patent
Cho et al.

(10) Patent No.: US 7,095,041 B2
(45) Date of Patent: Aug. 22, 2006

(54) HIGH-EFFICIENCY LIGHT EMITTING DIODE

(75) Inventors: Jae-hee Cho, Kyungki-do (KR); Hye-jeong Oh, Seoul (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/420,827

(22) Filed: Apr. 23, 2003

(65) Prior Publication Data

US 2004/0046166 A1    Mar. 11, 2004

(30) Foreign Application Priority Data

Sep. 9, 2002    (KR)  ............................. 2002-54327

(51) Int. Cl.
*H01L 29/06* (2006.01)
*H01L 31/0328* (2006.01)
*H01L 31/0336* (2006.01)
*H01L 31/072* (2006.01)
*H01L 31/109* (2006.01)

(52) U.S. Cl. ........................ 257/13; 257/79; 257/80; 257/81; 257/86; 257/91; 257/94; 257/96; 257/97; 257/99; 257/103; 257/918

(58) Field of Classification Search .................. 257/13, 257/79–81, 86, 94, 99, 103, 918, 91, 96, 257/97
See application file for complete search history.

(56) References Cited

U.S. PATENT DOCUMENTS

| | | | | |
|---|---|---|---|---|
| 4,700,210 A | * | 10/1987 | Burton et al. ................. | 257/95 |
| 5,636,234 A | * | 6/1997 | Takagi ..................... | 372/43.01 |
| 5,898,185 A | * | 4/1999 | Bojarczuk et al. .......... | 257/103 |
| 5,952,681 A | * | 9/1999 | Chen .......................... | 257/89 |
| 5,959,401 A | * | 9/1999 | Asami et al. ............... | 313/503 |
| 5,990,500 A | * | 11/1999 | Okazaki ...................... | 257/99 |
| 6,033,927 A | * | 3/2000 | Shibata et al. .............. | 438/33 |
| 6,040,588 A | * | 3/2000 | Koide et al. ................. | 257/15 |
| 6,091,084 A | * | 7/2000 | Fujii .......................... | 257/82 |
| 6,097,040 A | * | 8/2000 | Morimoto et al. ........... | 257/91 |
| 6,100,545 A | * | 8/2000 | Chiyo et al. ................. | 257/98 |
| 6,107,644 A | * | 8/2000 | Shakuda et al. ............. | 257/79 |
| 6,130,446 A | * | 10/2000 | Takeuchi et al. ............. | 257/99 |
| 6,133,058 A | * | 10/2000 | Kidoguchi et al. .......... | 438/47 |
| 6,153,894 A | * | 11/2000 | Udagawa ..................... | 257/96 |
| 6,399,963 B1 | * | 6/2002 | Sugawara et al. ........... | 257/96 |

(Continued)

FOREIGN PATENT DOCUMENTS

JP    11168239    6/1999

*Primary Examiner*—Ida M. Soward
(74) *Attorney, Agent, or Firm*—Buchanan Ingersoll & Rooney PC

(57) ABSTRACT

A high-efficiency light emitting diode is provided. The light emitting diode includes a substrate; a first compound semiconductor layer formed on the top surface of the substrate; a first electrode formed on a region of the first compound semiconductor layer; an active layer formed on a region of the first compound semiconductor layer excluding the region with the first electrode layer, in which 430-nm or less wavelength light is generated; a second compound semiconductor layer formed on the active layer; and a second electrode formed on the second compound semiconductor layer, with a filling ratio of 20–80% with respect to the area of the top surface of the substrate. The light emission of a 430-nm or less light emitting diode can be enhanced by adjusting the size of the p-type second electrode within the range of 20–80%.

25 Claims, 12 Drawing Sheets

U.S. PATENT DOCUMENTS

| | | |
|---|---|---|
| 6,437,363 B1 * | 8/2002 | Kadota et al. ................. 257/43 |
| 6,445,007 B1 * | 9/2002 | Wu et al. ..................... 257/80 |
| 6,522,676 B1 * | 2/2003 | Goto et al. ................... 372/43 |
| 6,583,442 B1 * | 6/2003 | Ito ............................... 257/79 |
| 6,583,449 B1 * | 6/2003 | Northrup et al. ........... 257/102 |
| 2001/0010449 A1 * | 8/2001 | Chiu et al. .................. 313/501 |
| 2002/0031153 A1 * | 3/2002 | Niwa et al. ................... 372/45 |
| 2002/0041148 A1 * | 4/2002 | Cho et al. ................... 313/499 |
| 2002/0047128 A1 * | 4/2002 | Song et al. ................... 257/82 |
| 2002/0088985 A1 * | 7/2002 | Komoto et al. ................ 257/99 |
| 2002/0145147 A1 * | 10/2002 | Chiou et al. .................. 257/79 |
| 2003/0006422 A1 * | 1/2003 | Miki et al. .................... 257/99 |
| 2003/0016526 A1 * | 1/2003 | Sakai et al. ................... 362/94 |
| 2003/0107053 A1 * | 6/2003 | Uemura et al. ............. 257/200 |
| 2004/0026702 A1 * | 2/2004 | Yamada et al. ................ 257/80 |
| 2004/0041261 A1 * | 3/2004 | Kinsman ..................... 257/737 |
| 2004/0208216 A1 * | 10/2004 | Naone et al. .................. 372/45 |
| 2005/0179051 A1 * | 8/2005 | Kondoh et al. ............. 257/103 |

* cited by examiner

HIGH-EFFICIENCY LIGHT EMITTING DIODE

BACKGROUND OF THE INVENTION

This application claims priority from Korean Patent Application No. 2002-54327, filed on Sep. 9, 2002, in the Korean Intellectual Property Office, the disclosure of which is incorporated herein in its entirety by reference.

1. Field of the Invention

The present invention relates to a light emitting diode, and more particularly, to a light emitting diode whose light emission is enhanced by appropriately varying the size of its p-type electrode.

2. Description of the Related Art

Light emitting diodes are widely known as a device used for data transmission in the optical communications field, for data recording and reproduction in compact disc players (CDPs) or digital versatile disk players (DVDPs), and for outdoor display.

FIG. 1 is a sectional view of a conventional light emitting diode (LED) having an InGaN—AlGaN heterojunction structure. Referring to FIG. 1, an n-GaN layer 3 is formed on a sapphire substrate 1 with a GaN buffer layer 2 interposed therebetween. An $In_{0.06}Ga_{0.94}N$ active layer 5, where light is generated, and p-$Al_{0.15}Ga_{0.85}N$ layer 6 are formed on the n-GaN layer 3. The sequential deposition of the n-GaN layer 3, the $In_{0.06}Ga_{0.94}N$ active layer 5, the p-$Al_{0.15}Ga_{0.85}N$ layer 6, and the p-GaN layer 7 is followed by patterning to a depth in the GaN layer 3, and a n-type electrode 8 is attached to the n-GaN layer 3. A p-type electrode 9 is arranged on the p-GaN layer 3 and is electrically connected to an external power source (not shown) via a bonding pad 10, which is arranged to contact to an edge of the p-GaN layer 7.

Most conventional LEDs generate light of a blue or red wavelength range and emit the light toward the front side through a transparent p-type electrode. Conventionally, as illustrated in FIG. 1, the p-type electrode 9 is formed on the entire surface of the p-GaN layer 7 in order to emit light through a larger area. As the size of the p-type electrode 9 increases, driving voltage becomes lower, enabling stable light emission at a low current density.

FIGS. 2A and 2B illustrate examples of conventional light emitting diodes where a p-type electrode, a bonding pad, and a n-type electrode are arranged in different patterns. Reference numerals 8a and 8b denote n-type electrodes, reference numerals 9a and 9b denote p-type electrodes, and reference numerals 10a and 10b denote bonding pads. As shown in the photographs of FIGS. 2A and 2B, light is emitted through the entire surface of the p-type electrodes 9a and 9b occupying most of the surface of the light emitting diode.

However, in conventional 430-nm or less light emitting diodes, light emission tends to decrease with increasing area of the p-type electrode. Therefore, there is a need to appropriately adjust the size of the p-type electrode in light emitting diodes which emit light of these wavelengths, to increase light emission.

SUMMARY OF THE INVENTION

The present invention provides a light emitting diode capable of emitting light of a wavelength of 430 nm or less with enhanced light output by adjusting the size of its p-type electrode within a predetermined range.

In accordance with an aspect of the present invention, there is provided a light emitting diode comprising: a substrate; a first compound semiconductor layer formed on the top surface of the substrate; a first electrode formed on a region of the first compound semiconductor layer; an active layer formed on a region of the first compound semiconductor layer excluding the region with the first electrode layer, in which 430-nm or less wavelength light is generated; a second compound semiconductor layer formed on the active layer; and a second electrode formed on the second compound semiconductor layer, with a filling ratio of 20–80% with respect to the area of the top surface of the substrate.

According to specific embodiments of the present invention, the light generated in the active layer is UV light having a wavelength of 200–430 nm. The filling ratio of the second electrode is in a range of 30–50% with respect to the area of the top surface of the substrate. The first electrode is an n-type electrode, and the second electrode is a p-type electrode. The light emitting diode further comprises a bonding pad on the second compound layer, the bonding pad connecting the second electrode to an external power source.

The first compound semiconductor layer may be an n-doped or undoped GaN-based III-V nitride compound semiconductor layer. The second compound semiconductor layer may be a p-doped GaN-based III-V nitride compound semiconductor layer. The active layer may be formed of an n-doped or undoped $In_xAl_yGa_{1-x-y}N$ compound semiconductor layer where $0 \leq x \leq 1$, $0 \leq y \leq 1$, and $x+y \leq 1$ and may have a quantum-well structure or a multiple quantum-well structure. In this case, the light emitting diode may further comprise a first cladding layer between the active layer and the first compound semiconductor layer and a second cladding layer between the active layer and the second compound semiconductor layer, the first and second cladding layers having a smaller refractive index than the active layer.

The first cladding layer may be a p-doped GaN-based III-V nitride compound semiconductor layer, and the second cladding layer may be an n-doped GaN-based III-V nitride compound semiconductor layer. The light emitting diode may further comprise a first waveguide layer between the active layer and the first cladding layer and a second waveguide layer between the active layer and the second cladding layer, the first and second waveguide layers having a larger refractive index than the respective first and second cladding layers. In this case, the first and second waveguide layers are GaN-based III-V nitride compound semiconductor layers.

The present invention also provides a light emitting diode having a flip-chip structure, comprising a flip-chip body including: a substrate that transmits light; a first compound semiconductor layer formed on the top surface of the substrate; a first electrode formed on a region of the first compound semiconductor layer; an active layer formed on a region of the first compound semiconductor layer excluding the region with the first electrode layer, in which 430-nm or less wavelength light is generated; a second compound semiconductor layer formed on the active layer; and a second electrode formed on the second compound semiconductor layer, with a filling ratio of 20–80% with respect to the area of the top surface of the substrate. In addition to the flip-chip body, the light emitting diode comprises a sub mount to which the first and second electrodes of the flip-chip body are attached by soldering, and bonding pads formed on the sub mount to connect the first and second electrodes to an external power source.

According to specific embodiments of the light emitting diode having the flip-chip structure of the present invention, the light generated in the active layer is UV light having a wavelength of 200–430 nm. The filling ratio of the second electrode is in a range of 30–50% with respect to the area of the top surface of the substrate. The first electrode is an n-type electrode, and the second electrode is a p-type electrode. The first compound semiconductor layer is a n-doped or undoped GaN-based III-V nitride compound semiconductor layer. The second compound semiconductor layer is a p-doped GaN-based III-V nitride compound semiconductor layer. The active layer is formed of an n-doped or undoped $In_xAl_yGa_{1-x-y}N$ compound semiconductor layer where $0 \leq x \leq 1$, $0 \leq y \leq 1$, and $x+y \leq 1$.

The light emitting diode having the flip-chip structure may further comprise a first cladding layer between the active layer and the first compound semiconductor layer and a second cladding layer between the active layer and the second compound semiconductor layer, the first and second cladding layers having a smaller refractive index than the active layer. In this case, the first cladding layer is a p-doped GaN-based III-V nitride compound semiconductor layer, and the second cladding layer is an n-doped GaN-based III-V nitride compound semiconductor layer. The light emitting diode may further comprise a first waveguide layer between the active layer and the first cladding layer and a second waveguide layer between the active layer and the second cladding layer, the first and second waveguide layers having a larger refractive index than the respective first and second cladding layers. The first and second waveguide layers are GaN-based III-V nitride compound semiconductor layers.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Embodiments of a light emitting diode according to the present invention will be described.

Figure 1:
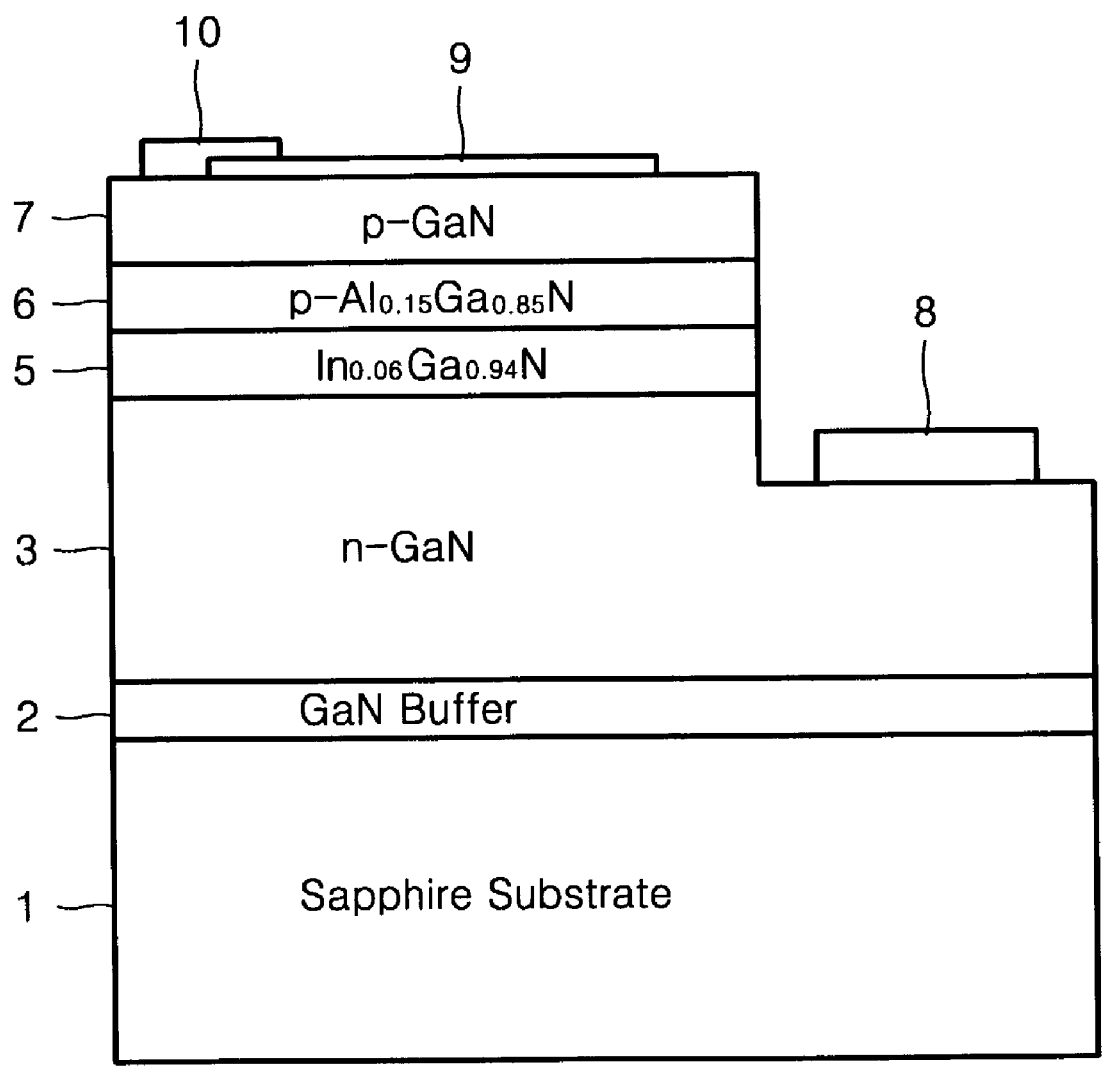
FIG. 1 is a sectional view of a conventional light emitting diode (LED) having an InGaN—AlInGaN heterojunction structure.
Figure 2A:
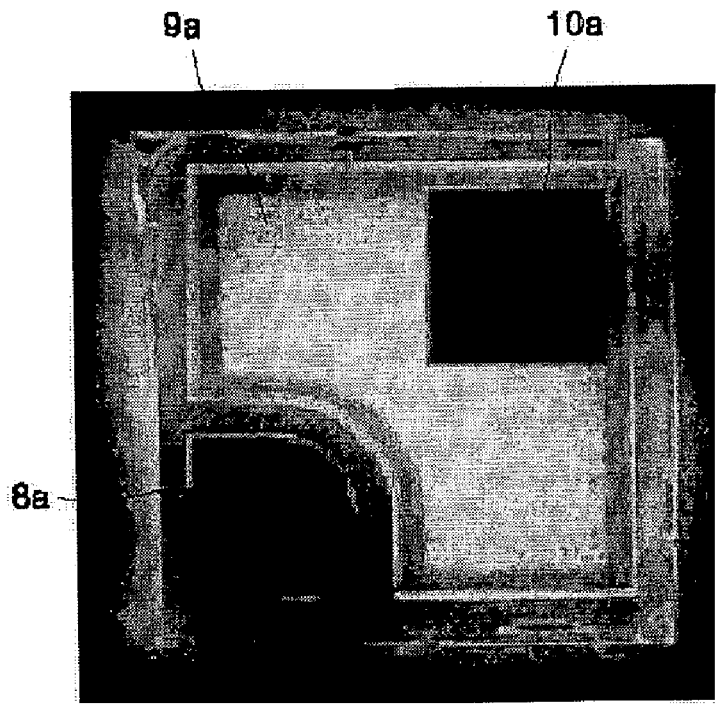
FIGS. 2A and 2B are photographs of examples of conventional light emitting diodes where a p-type electrode, a bonding pad, and an n-type electrode are arranged in different patterns.
Figure 2B:
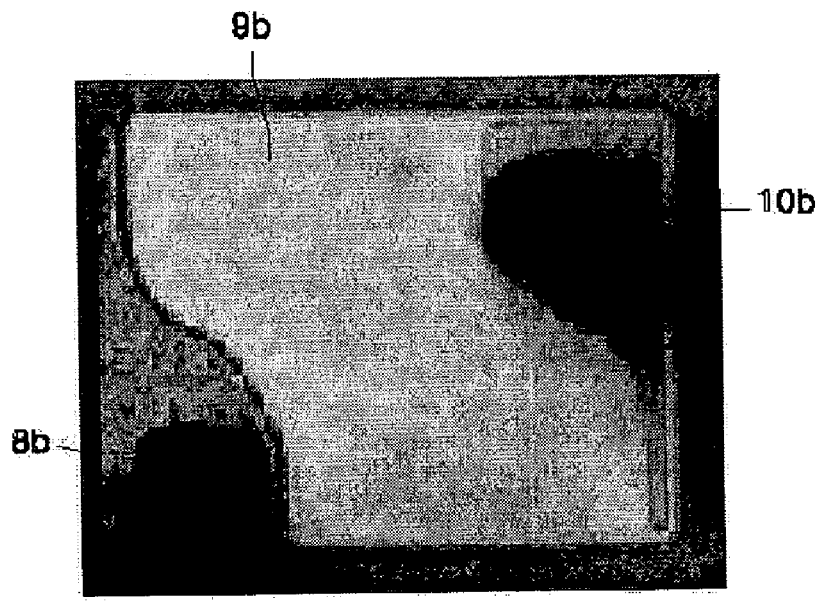
Figure 3:
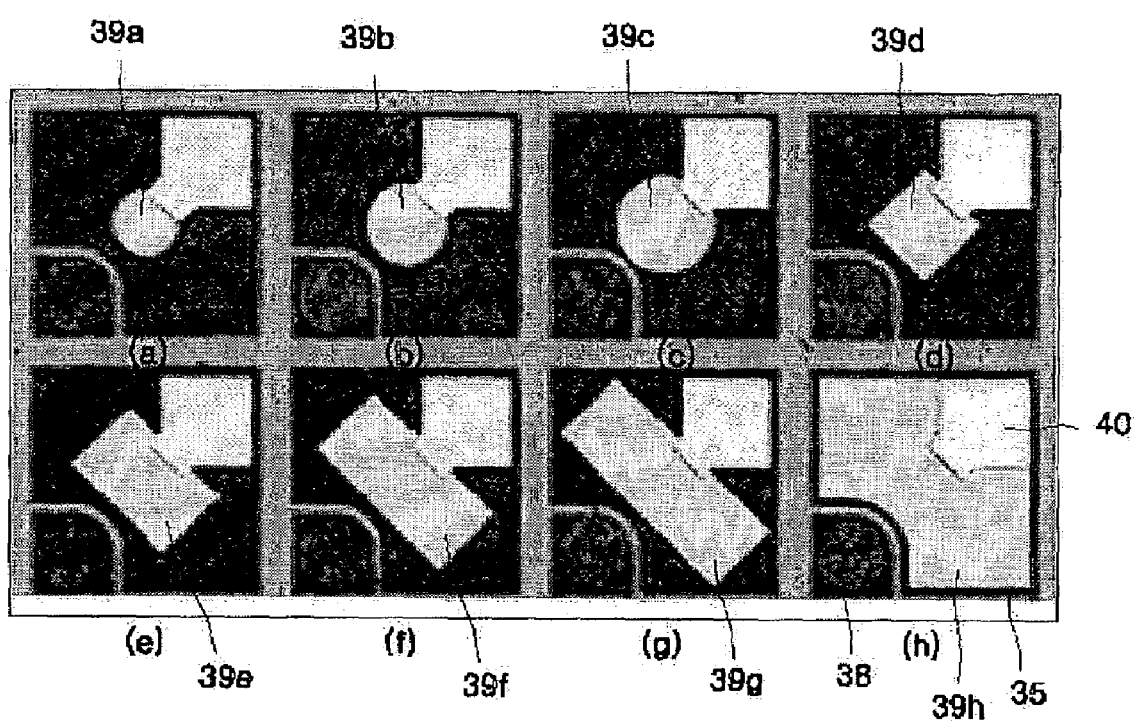
FIG. 3 shows examples of p-type electrodes having various sizes.

Experimental examples of p-type electrodes having various sizes are shown in FIG. 3, which were used to measure change in light emission in 384-nm light emitting diodes at a given current when the size of the p-type electrode is varied. In FIG. 3, (a) shows a light emitting diode (LED) with a circular p-type electrode 39a having a diameter of 80 µm, (b) shows a LED with a circular p-type electrode 39b having a diameter of 100 µm, (c) shows a LED with a circular p-type electrode 39c having a diameter of 120 µm, (d) shows a LED with a rectangular 100×100 µm² p-type electrode 39d, (e) shows a LED with a rectangular 150×100 µm² p-type electrode 39e, (f) shows a LED with a rectangular 200×100 µm² p-type electrode 39f, (g) shows a LED with a rectangular 250×100 µm² p-type electrode 39g, and (h) denotes an LED with a p-type electrode 39h which covers the surface area of the diode chip excluding an n-type electrode 38 and a bonding pad 40. Reference numeral 35 denotes an etched side of a mesa structure of the LED.

Figure 4:
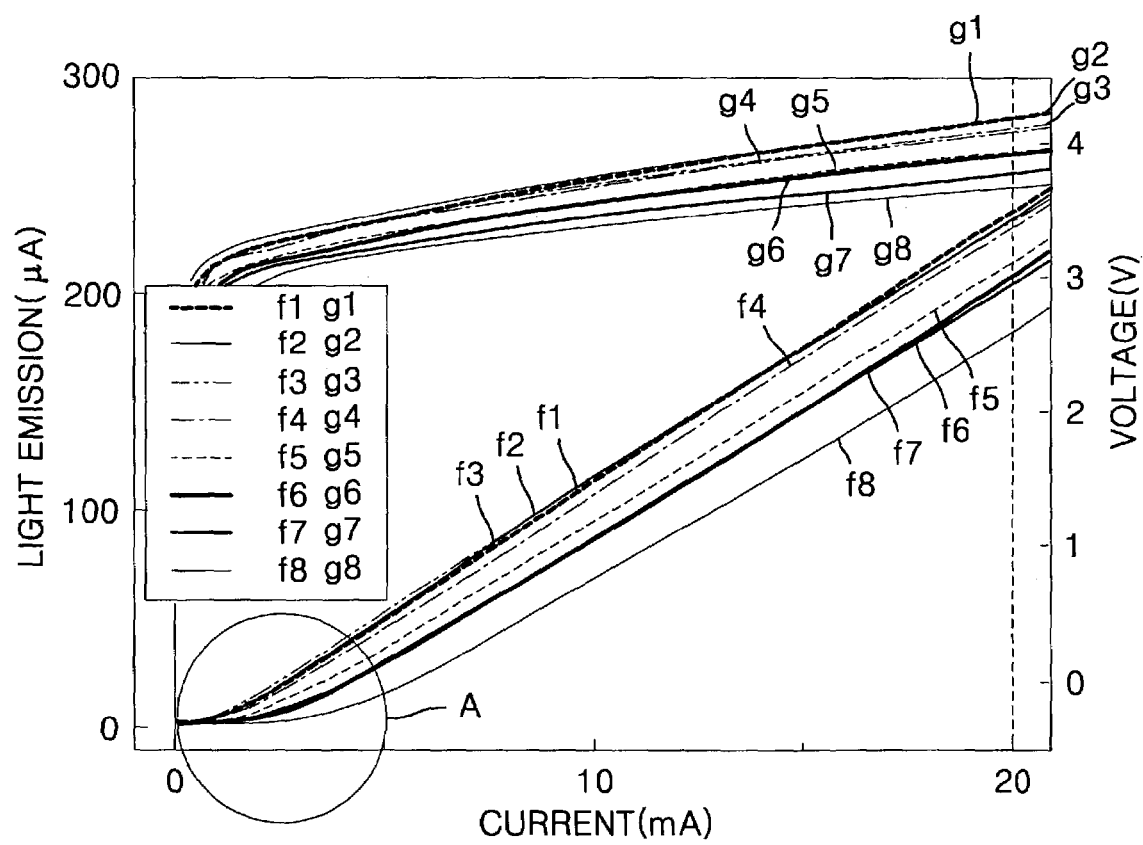
FIG. 4 is a graph of change in voltage and light emission versus current applied to an electrode in the light emitting diodes of FIG. 3, which emit 384-nm and 393-nm light.

FIG. 4 is a graph of change in voltage and light emission versus current applied to an electrode in the light emitting diodes of FIG. 3, which emit 384-nm and 393-nm light. Referring to FIG. 4, plots g1, g2, g3, g4, g5, g6, g7, and g8 show change in voltage with respect to current applied to the 393-nm LEDs having the p-type electrodes 39a, 39b, 39c, 39d, 39e, 39f, 39g, and 39h of FIG. 3, respectively, and plots f1, f2, f3, f4, f5, f6, f7, and f8 show change in light emission with respect to current applied to the respective light-emitting diodes. For 384-nm light, voltage and light emission vary with respect to current in a similar pattern as in FIG. 4.

Light emission increases linearly with current. However, at any given current level, light emission and voltage are greatest for the LED having the smallest p-type electrode 39a, as indicated by f1 and g1, decrease gradually with increasing electrode size, and are lowest for the LED having the largest p-type electrode 39h, as indicated by f8 and g8. This is opposite to the relationship between light emission and electrode size in conventional LEDs emitting longer wavelength light.

Figure 5:
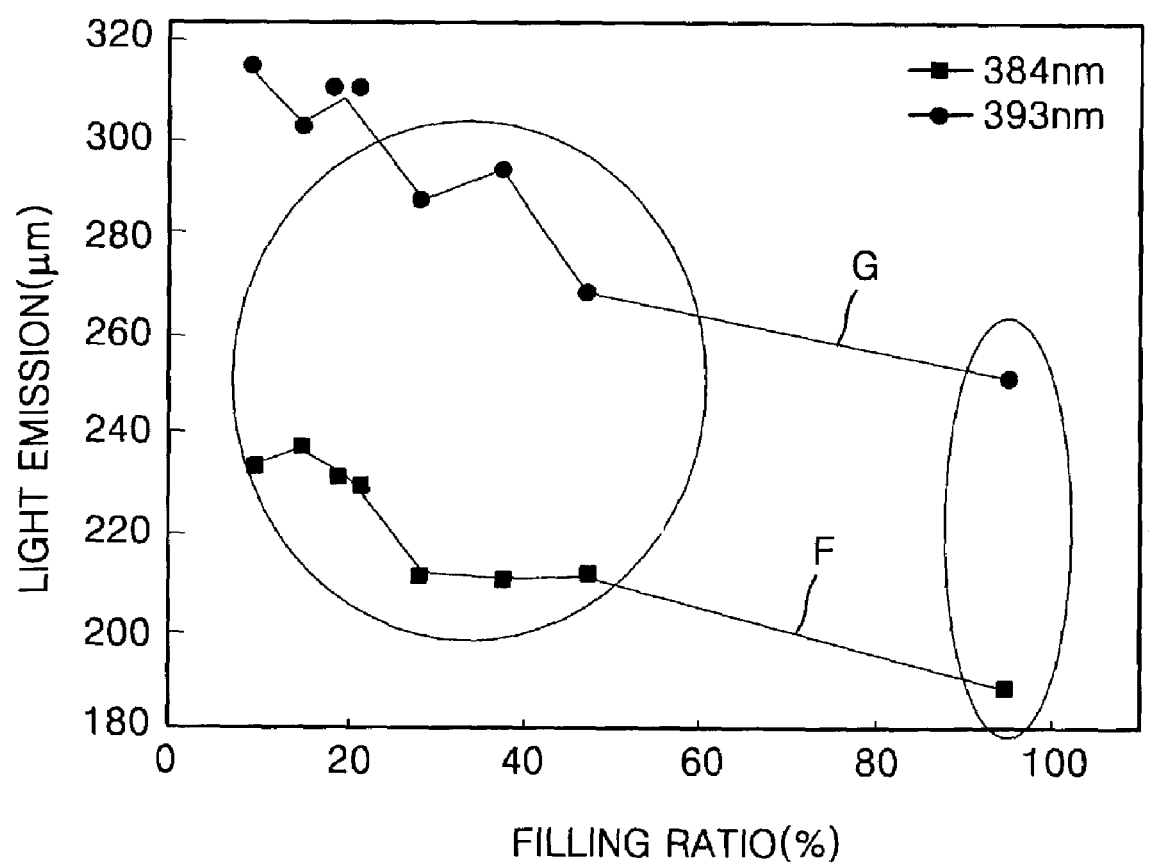
FIG. 5 is a graph of light emission at a current of 20 mA with respect to filling ratio of the various p-type electrodes of FIG. 3, which is obtained from the graph of FIG. 4.

FIG. 5 is a graph of light emission at a current of 20 mA with respect to filling ratio of the various p-type electrodes of FIG. 3, which is obtained from the graph of FIG. 4. Here, "filling ratio" means the ratio of the area of the p-type electrode to the area of the top surface of the substrate. In FIG. 5, plot F is for the 384-nm LEDs and plot G is for the 393-nm LEDs.

As is apparent from FIG. 5, light emission decreases with increasing filling ratio. However, for filling ratios ranging from 10% to 40%, light emission fluctuates rather than decreases linearly.

Figure 6:
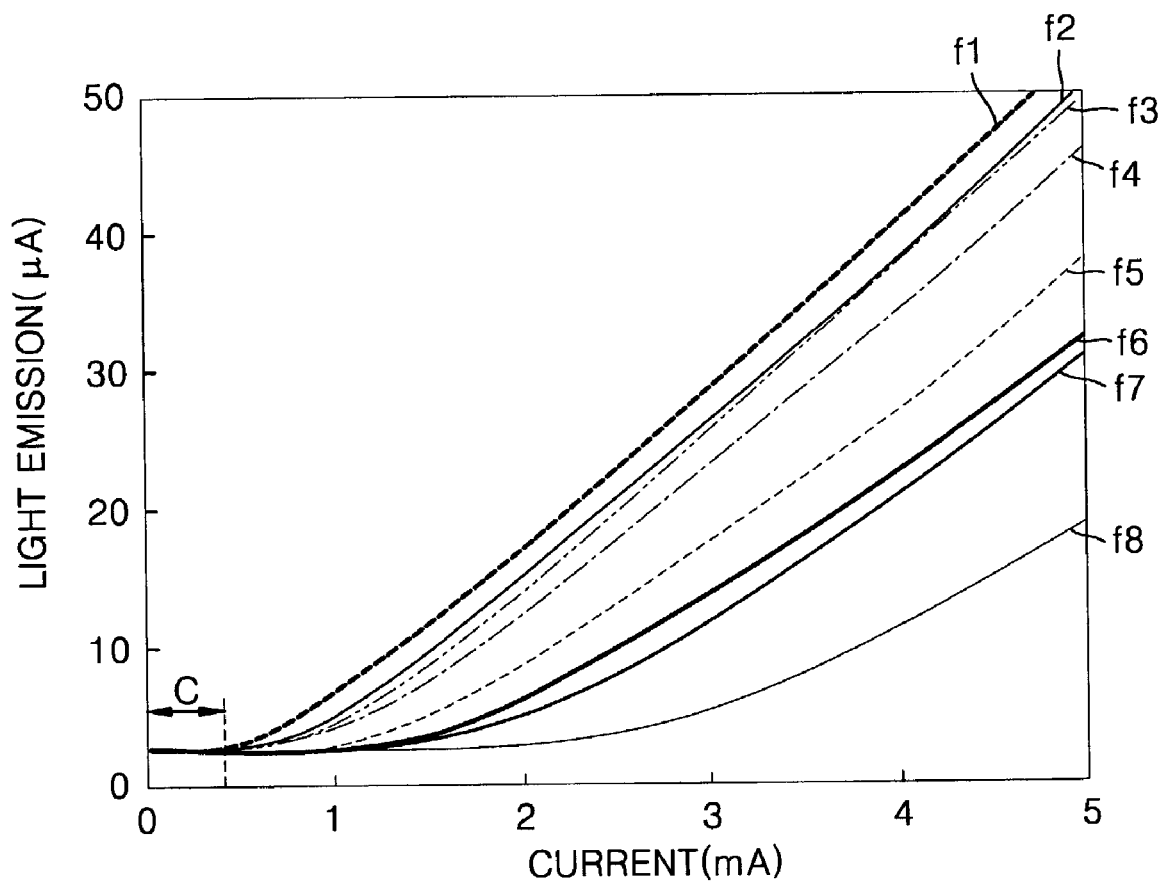
FIG. 6 is an enlarged graph of region A of FIG. 4.

FIG. 6 is an enlarged graph of region A of FIG. 4. Referring to FIG. 6, in all of plots f1 through f8, region C appears where no light emission occurs within a current range less than 0.5 mA, which never appears in conventional LEDs emitting longer wavelength light. The current within region C is called dead current. This dead current is considered as possibly contributing to the reduction in light emission with increasing filling ratio of the p-type electrode in 384-nm and 393-nm LEDs.

In general, the active layer of LEDs formed as a semiconductor layer, especially one having a quantum-well structure, includes numerous defects that consume energy generated by combination of electrons and holes as heat energy, rather than allow the LED to use all of the energy to generate light. However, in conventional nitride-based LEDs emitting longer wavelength light, defects in the active layer do not act as a hindrance to emitting light due to the nature of materials composing the LED, so that a larger current can be applied by increasing the size of the p-type electrode to enable stable light emission at a low driving voltage. These principles also work in nitride-based LEDs emitting blue wavelength light. However, in LEDs emitting shorter wavelength light than blue light, for example, violet light (400–450 nm) or UV light (200–400 nm), light emission decreases with increasing p-type electrode size, as described above, indicating that the above principles do not work in these types of LEDs. For a larger p-type electrode, the active layer has more defects, which includes dislocation, even though their density is the same as smaller p-type electrodes. As a result, in LEDs emitting 430-nm or less wavelength light where a large current is injected, thermal loss becomes larger, leading to a dead current, so that light emission of the LED decreases.

Figure 7:
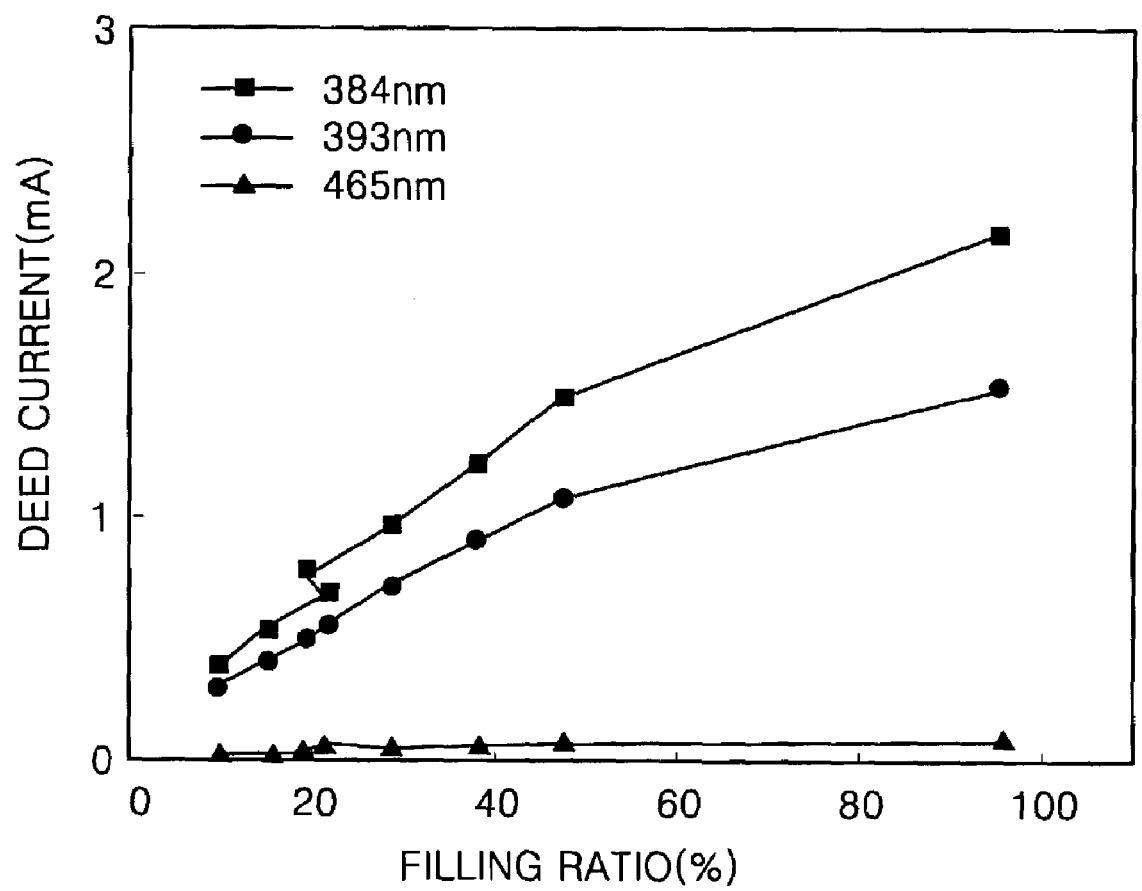
FIG. 7 is a graph of change in dead current with respect to filling ratio of the p-type electrode in 393-nm, 393-nm, and 465-nm LEDs.

FIG. 7 is a graph of change in dead current with respect to filling ratio of the p-type electrode in 384-nm, 393-nm, and 465-nm LEDs.

Referring to FIG. 7, in the 465-nm LED has nearly zero dead current regardless of the filling ratio of the electrode. However, as described with reference to the graphs above, in the 384-nm and 393-nm LEDs, dead current increases with increasing filling ratio.

Figure 8:
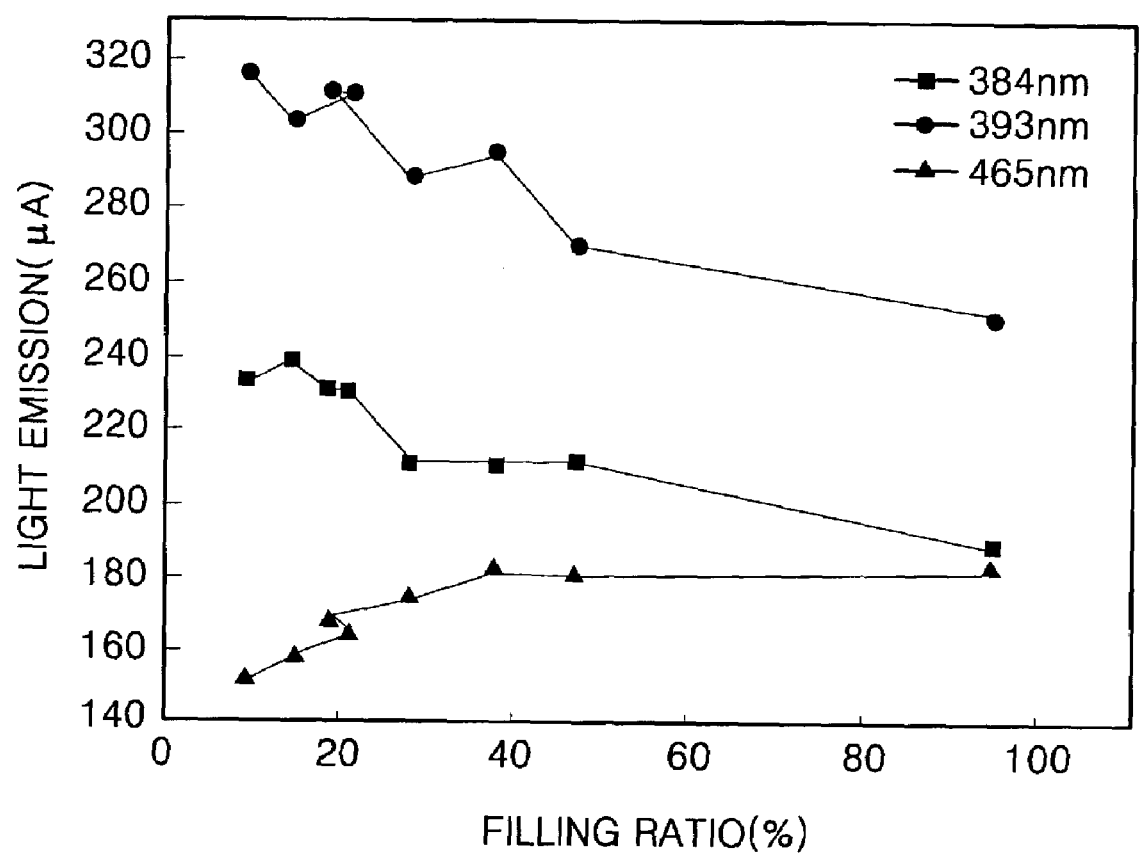
FIG. 8 is a graph of light emission with respect to filling ratio of the p-type electrode in 384-nm, 393-nm, and 465-nm LEDs.

FIG. 8 is a graph of light emission with respect to filling ratio of the p-type electrode in 384-nm, 393-nm, and 465-nm LEDs. As shown in FIG. 8, the 465-nm LED has larger light emission with increasing filling ratio. However, the 384-nm and 393-nm LEDs have smaller light emission with increasing filling ratio.

As described above, unlike 465-nm LEDs, light emission increases with smaller filling ratio of the p-type electrode in 384-nm and 393-nm LEDs. Therefore, LEDs according to the present invention, which emit 430-nm or less wavelength light, are manufactured with a reduced-size p-type electrode.

Figure 9:
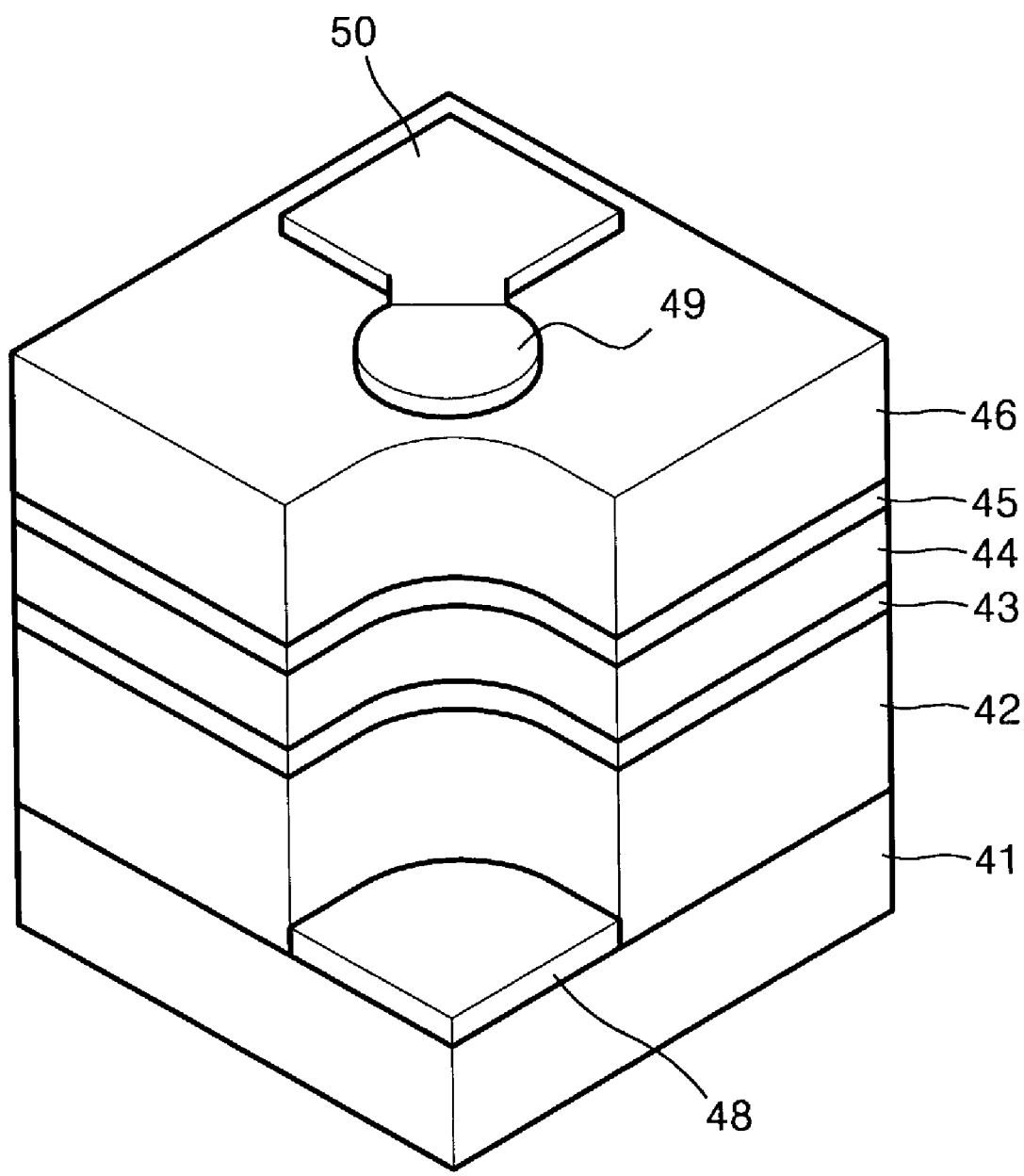
FIG. 9 is a perspective view of a LED according to a first embodiment of the present invention.

FIG. 9 is a perspective view of a LED according to a first embodiment of the present invention. The top view of the LED of FIG. 9 is equivalent to (a) of FIG. 3.

Referring to FIG. 9, a first compound semiconductor layer 42, an active layer 44, and a second compound semiconductor layer 46 are deposited in sequence on the top surface of a substrate 41, with a first cladding layer 43 between the first compound semiconductor layer 42 and the active layer 44 and a second cladding layer 45 between the active layer 44 and the second compound semiconductor layer 46. A first electrode 48 is attached to an etched stepped corner of the first compound semiconductor layer 42. In particular, after the first compound semiconductor layer 42, the first cladding layer 43, the active layer 44, the second cladding layer 45, and the second compound semiconductor layer 46 are sequentially deposited on the substrate 41, the resulting stack is etched to a depth in the first compound semiconductor layer 42 using a pattern formed on the stack by photolithography. A second electrode 49 and a bonding pad 50 are formed on the top surface of the second compound semiconductor layer 46.

In an embodiment according to the present invention, the second electrode 49 has a filling ratio of 20–80%. As described above, in LEDs emitting 430-nm or less wavelength light, light emission increases with decreasing filling ratio of the p-type electrode.

The substrate 41 is formed of a durable substance, mostly, a sapphire substrate. However, Si, SiC, and GaN substrates may be used for the substrate 41.

The first compound semiconductor layer 42 is a GaN-based III-V nitride semiconductor layer capable of emitting light, and preferably, is a direct transition type. In the case of doping the first compound semiconductor 42 with conductive impurities, a GaN layer is preferable for the first compound semiconductor layer 42. In either case, it is preferable that the first compound semiconductor layer 42 is formed of the same material as the second compound semiconductor layer 46. The first cladding layer 43 is formed on the top surface of the first compound semiconductor layer 42. Preferably, the first cladding layer 43 may be formed of an n-AlGaN/GaN layer having a predetermined refractive index. However, the first cladding layer 43 may be formed of any compound semiconductor layer capable of emitting light, different from the n-AlGaN/GaN layer.

The second compound semiconductor layer 46 is a GaN-based III-V nitride semiconductor layer, and preferably, is a direct transition type doped with p-type conductive impurities, and most preferably, is a p-GaN layer. A GaN layer or an AlGaN layer or InGaN layer containing Al or In, respectively, in a predetermined ratio may be used for the second compound semiconductor layer 46.

The second cladding layer 45 is formed of a p-type compound semiconductor layer when the first cladding layer 43 is an n-type compound semiconductor layer, and is formed of an n-type compound semiconductor layer when the first cladding layer 43 is a p-type compound semiconductor layer. For example, when the first cladding layer 43 is formed of an n-AlInGaN layer, the second cladding layer 45 is formed of a p-AlInGaN layer.

The active layer 44 is formed on the top surface of the first cladding layer 43. The active layer 44 is a material layer where light is generated by the recombination of electrons and holes. Preferably, the active layer 44 is a GaN-based III-V nitride semiconductor layer with a multiple quantum-well (MQW) structure. More preferably, the active layer 44 is formed of an $In_xAl_yGa_{1-x-y}N$, where $0 \leq x \leq 1$, $0 \leq y \leq 1$, and $x+y \leq 1$, with a MQW structure.

First and second waveguide layers (not shown) may be further formed on and underneath the active layer 44, respectively, to amplify light emitted from the active layer 44 and emit light from the LED with enhanced intensity. The first and second waveguide layers are formed of a smaller refractive index material than the active layer 44, and preferably, for example, a GaN-based III-V compound semiconductor layer. For example, the first waveguide layer may be formed of a n-GaN layer, and the second waveguide layer may be formed of a p-GaN layer. The active layer 44 may be formed of any material capable of lasing radiation, and preferably, a material with good internal quantum efficiency. Preferably, the active layer 44 is formed of an InAlGaN layer containing In and Al in a predetermined ratio.

Electrons are injected into the first compound semiconductor layer 42 via the first electrode 48, which is an n-type electrode, and holes are injected into the second compound semiconductor layer 46 via the second electrode 49, which is a p-type electrode. The injected electrons and holes combine together and disappear in the active layer 44 to oscillate short wavelength band light. The color of emitted light varies depending on the wavelength band. The wavelength band of light is determined by the energy width between the conduction band and valence band of the material used to form the light emitting laser diode.

In a LED emitting 430-nm or less wavelength light according to the present invention, the filling ratio of the second electrode 49 is determined to be in a range of 20–80% to increase light emission. If the filling ratio of the second electrode 49 is less than 20%, the resulting LED has a reliability problem of generating excess heat instead of emitting light. If the filling ratio of the second electrode 49 exceeds 80%, light emission becomes too low. Therefore, the filling ratio of the second electrode 49 is determined in a range of 20–80%, and preferably, 30–50%.

Figure 10:
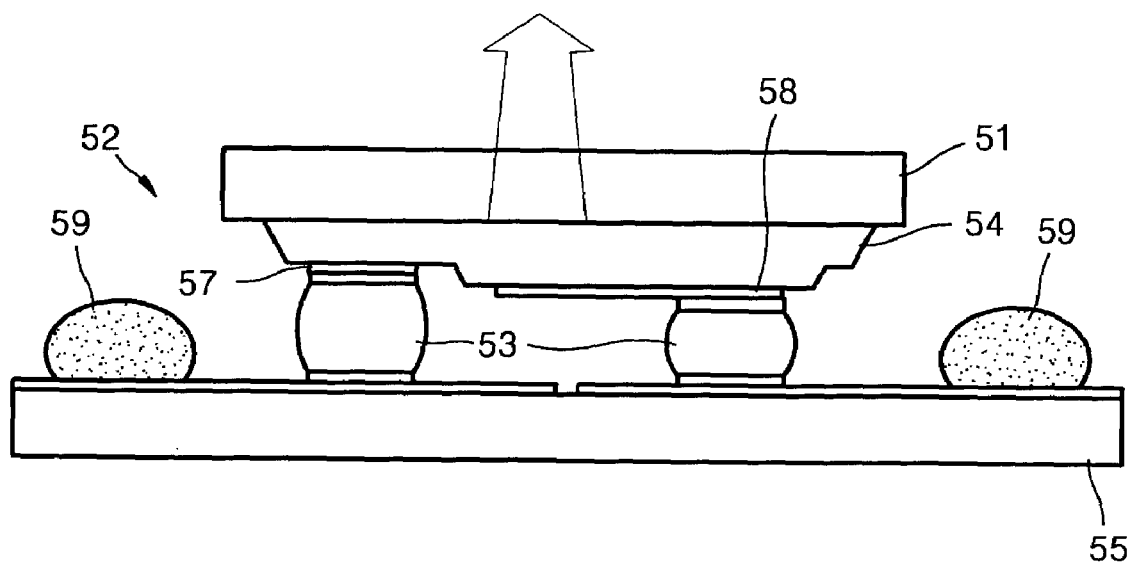
FIG. 10 is a sectional view of an LED according to a second embodiment of the present invention.

FIG. 10 is a sectional view of an LED according to a second embodiment of the present invention. In this embodiment, the LED is formed of a GaN semiconductor material with a flip-chip configuration.

Referring to FIG. 10, a pair of bonding pads 59, which are connected to an external power source, are mounted on the top surface of a sub mount 55. A flip-chip body 52 is arranged facing the sub mount 55. The flip-chip body 52 includes a substrate 51 and a compound semiconductor layer 54 formed on the substrate 51. This compound semiconductor layer 54 includes a first compound semiconductor layer, a first cladding layer, an active layer, a second cladding layer, and a second compound semiconductor layer, all of which are not shown, as in the LED according to the first embodiment of the present invention. A first electrode 57 is formed on an etched stepped region of the first compound semiconductor layer, and a second electrode 58 is formed on the surface of the second compound semiconductor layer. Electrons are injected via the first electrode 57 into the active layer, and holes are injected via the second electrode 58 into the active layer, wherein the injected electrons and holes combine together in the active layer to generate light.

The first electrode 57 and the second electrode 58 are attached to the sub mount 55 by soldering. In FIG. 10, solder bumps 53 as connectors are shown. The first and second electrodes 57 and 58 are connected to the external power source via the bonding pads 59 formed on both edges of the sub mount 55.

In a LED according to the second embodiment of the present invention, the first electrode 57 may be formed as an n-type electrode, and the second electrode 58 may be formed as a p-type electrode, wherein the second electrode 58 has a filling ratio of 20–80%, so that 430-nm or less wavelength light can be generated in the active layer with enhanced intensity. Preferably, the second electrode 58 has a filling ratio of 30–50%.

Figure 11:
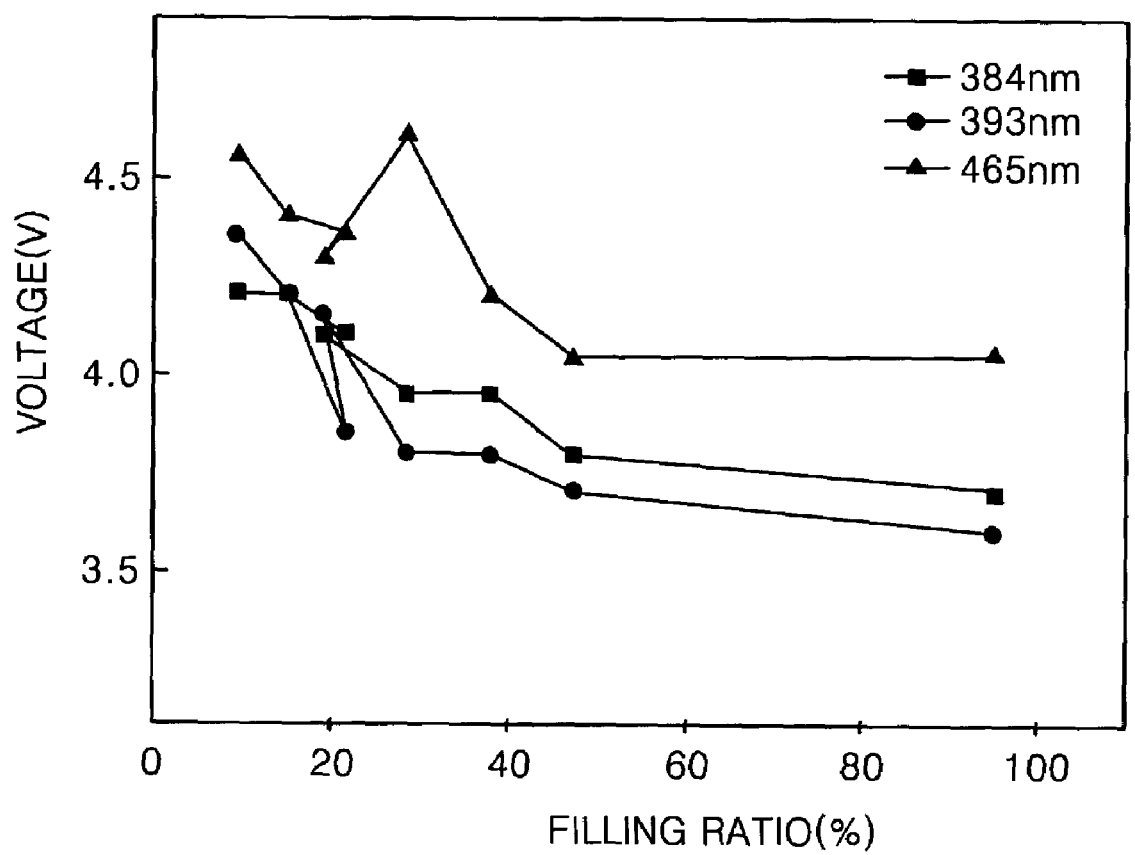
FIG. 11 is a comparative graph of driving voltage versus filling radio of the p-type electrode at a 20-mA driving current in a conventional 465-nm LED and 384-nm and 393-nm LEDs according to embodiments of the present invention.

FIG. 11 is a comparative graph of driving voltage versus filling radio of the p-type electrode at a 20-mA driving current in a conventional 465-nm LED and 384-nm and 393-nm LEDs according to embodiments of the present invention. As shown in FIG. 11, driving voltage slightly increases with decreasing filling ratio of the p-type electrode, indicating the possibility of light emission being enhanced in the LEDs according to the present invention by reducing the size of the p-type electrode.

Figure 12:
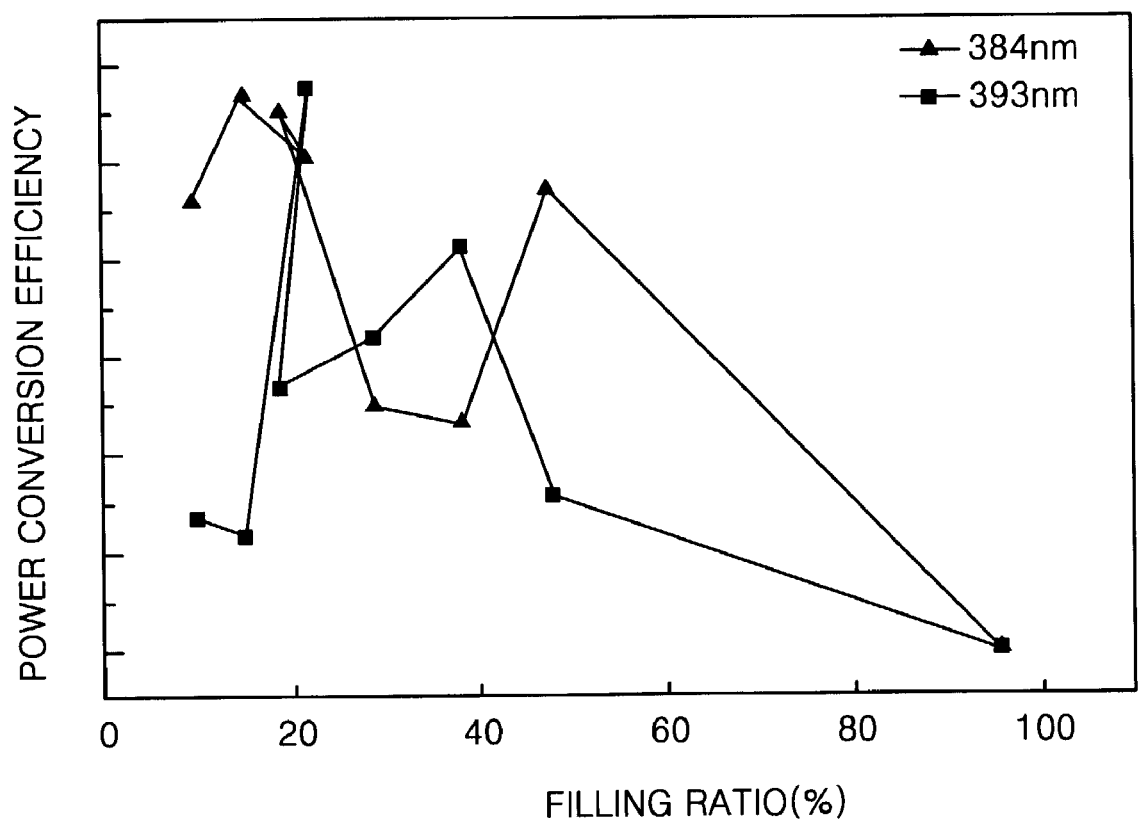
FIG. 12 is a graph of change in power conversion efficiency with respect to filling ratio of the p-type electrode in 384-nm and 393-nm LEDs according to embodiments of the present invention.

FIG. 12 is a graph of change in power conversion efficiency with respect to filling ratio of the p-type electrode in 384-nm and 393-nm LEDs according to embodiments of the present invention. Here, "power conversion efficiency" means the ratio of light output to input electricity.

In FIG. 12, for filling ratios ranging from 20% to 40%, power conversion efficiency is higher. Although these experimental results may vary depending on the wavelength of light emitted from the LED, a peak light emission is expected at a filling ratio of the p-type electrode ranging from 20% to 80% in most LEDs emitting various wavelengths, including 384-nm and 393-nm LEDs according to the present invention. Therefore, it is preferable that the p-type electrode of 384-nm and 393-nm LEDs according to the present invention has a filling ratio of 20–80%.

In accordance with the forgoing, in a LED emitting 430-nm or less wavelength light according to the present invention, light emission can be enhanced by forming a p-type electrode with a filling ratio of 20–80% with respect to the area of the substrate.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A light emitting diode comprising:
   a substrate;
   a first compound semiconductor layer formed on the top surface of the substrate;
   a first electrode formed on a region of the first compound semiconductor layer;
   an active layer formed on a region of the first compound semiconductor layer excluding the region with the first electrode, in which 430 nm or less wavelength light is generated;
   a second compound semiconductor layer formed on the active layer; and
   a second transparent electrode formed on the second compound semiconductor layer, with a filling ratio of 20–80% with respect to the area of the top surface of the substrate.

2. The light emitting diode of claim 1, wherein the light generated in the active layer is UV light having a wavelength of 200–430 nm.

3. The light emitting diode of claim 1, wherein the filling ratio of the second electrode is in a range of 30–50% with respect to the area of the top surface of the substrate.

4. The light emitting diode of claim 1, wherein the first electrode is an n-type electrode, and the second electrode is a p-type electrode.

5. The light emitting diode of claim 1, further comprising a bonding pad on the second compound semiconductor layer, the bonding pad connecting the second electrode to an external power source.

6. The light emitting diode of claim 1, wherein the first compound semiconductor layer is an n-doped or undoped GaN-based III-V nitride compound semiconductor layer.

7. The light emitting diode of claim 6, wherein the second compound semiconductor layer is a p-doped GaN-based III-V nitride compound semiconductor layer.

8. The light emitting diode of claim 7, wherein the active layer is formed of an n-doped or undoped $In_xAl_yGa_{1-x-y}N$ compound semiconductor layer where $0 \leq x \leq 1$, $0 \leq y \leq 1$, and $x+y \leq 1$.

9. The light emitting diode of claim 8, wherein the active layer has a quantum-well structure or a multiple quantum-well structure.

10. A light emitting diode comprising:
    a substrate;
    a first compound semiconductor layer formed on the top surface of the substrate;

a first electrode formed on a region of the first compound semiconductor layer;

an active layer formed on a region of the first compound semiconductor layer excluding the region with the first electrode, in which 430 nm or less wavelength light is generated;

a second compound semiconductor layer formed on the active layer;

a second transparent electrode formed on the second compound semiconductor layer, with a filling ratio of 20–80% with respect to the area of the top surface of the substrate; and a first cladding layer between the active layer and the first compound semiconductor layer and a second cladding layer between the active layer and the second compound semiconductor layer, the first and second cladding layers having a smaller refractive index than the active layer.

11. The light emitting diode of claim 10, wherein the first cladding layer is a p-doped GaN-based III-V nitride compound semiconductor layer, and the second cladding layer is an n-doped GaN-based III-V nitride compound semiconductor layer.

12. The light emitting diode of claim 10, further comprising a first waveguide layer between the active layer and the first cladding layer and a second waveguide layer between the active layer and the second cladding layer, the first and second waveguide layers having a larger refractive index than the respective first and second cladding layers.

13. The light emitting diode of claim 12, wherein the first and second waveguide layers are GaN-based III-V nitride compound semiconductor layers.

14. A light emitting diode having a flip-chip structure, comprising:

a flip-chip body including: a substrate that transmits light; a first compound semiconductor layer formed on the top surface of the substrate; a first electrode formed on a region of the first compound semiconductor layer; an active layer formed on a region of the first compound semiconductor layer excluding the region with the first electrode layer, in which 430 nm or less wavelength light is generated; a second compound semiconductor layer formed on the active layer; and a second electrode formed on the second compound semiconductor layer, with a filling ratio of 20–80% with respect to the area of the top surface of the substrate;

a sub mount to which the first and second electrodes of the flip-chip body are attached by soldering; and bonding pads formed on the sub mount to connect the first and second electrodes to an external power source.

15. The light emitting diode of claim 14, wherein the light generated in the active layer is UV light having a wavelength of 200–430 nm.

16. The light emitting diode of claim 14, wherein the filling ratio of the second electrode is in a range of 30–50% with respect to the area of the top surface of the substrate.

17. The light emitting diode of claim 14, wherein the first electrode is an n-type electrode, and the second electrode is a p-type electrode.

18. The light emitting diode of claim 14, wherein the first compound semiconductor layer is a n-doped or undoped GaN-based III-V nitride compound semiconductor layer.

19. The light emitting diode of claim 18, wherein the second compound semiconductor layer is a p-doped GaN-based III-V nitride compound semiconductor layer.

20. The light emitting diode of claim 19, wherein the active layer is formed of an n-doped or undoped $In_xAl_yGa_{1-x-y}N$ compound semiconductor layer where $0 \leq x \leq 1$, $0 \leq y \leq 1$, and $x+y \leq 1$.

21. The light emitting diode of claim 20, wherein the active layer has a quantum-well structure or a multiple quantum-well structure.

22. A light emitting diode having a flip-chip structure, comprising:

a flip-chip body including: a substrate that transmits light; a first compound semiconductor layer formed on the top surface of the substrate; a first electrode formed on a region of the first compound semiconductor layer; an active layer formed on a region of the first compound semiconductor layer excluding the region with the first electrode layer, in which 430 nm or less wavelength light is generated; a second compound semiconductor layer formed on the active layer; and a second electrode formed on the second compound semiconductor layer, with a filling ratio of 20–80% with respect to the area of the top surface of the substrate;

a sub mount to which the first and second electrodes of the flip-chip body are attached by soldering;

bonding pads formed on the sub mount to connect the first and second electrodes to an external power source; and a first cladding layer between the active layer and the first compound semiconductor layer and a second cladding layer between the active layer and the second compound semiconductor layer, the first and second cladding layers having a smaller refractive index than the active layer.

23. The light emitting diode of claim 22, wherein the first cladding layer is a p-doped GaN-based III-V nitride compound semiconductor layer, and the second cladding layer is an n-doped GaN-based III-V nitride compound semiconductor layer.

24. The light emitting diode of claim 22, further comprising a first waveguide layer between the active layer and the first cladding layer and a second waveguide layer between the active layer and the second cladding layer, the first and second waveguide layers having a larger refractive index than the respective first and second cladding layers and a smaller refractive index than the active layer.

25. The light emitting diode of claim 24, wherein the first and second waveguide layers are GaN-based III-V nitride compound semiconductor layers.

* * * * *